(12) United States Patent  
Rajwade et al.

(10) Patent No.: US 9,792,997 B2  
(45) Date of Patent: Oct. 17, 2017

(54) RAMPING INHIBIT VOLTAGE DURING MEMORY PROGRAMMING

(71) Applicant: Intel Corporation, Santa Clara, CA (US)

(72) Inventors: Shantanu R. Rajwade, Sunnyvale, CA (US); Pranav Kalavade, San Jose, CA (US); Neal R. Mielke, Los Altos Hills, CA (US); Krishna K. Parat, Palo Alto, CA (US); Shyam Sunder Raghunathan, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/183,582

(22) Filed: Jun. 15, 2016

(65) Prior Publication Data

US 2016/0372207 A1     Dec. 22, 2016

Related U.S. Application Data

(63) Continuation of application No. 14/228,245, filed on Mar. 27, 2014, now Pat. No. 9,418,752.

(51) Int. Cl.
*G11C 11/34* (2006.01)
*G11C 16/34* (2006.01)
(Continued)

(52) U.S. Cl.
CPC ...... *G11C 16/3427* (2013.01); *G11C 16/0483* (2013.01); *G11C 16/08* (2013.01); *G11C 16/10* (2013.01)

(58) Field of Classification Search
CPC .................. G11C 8/14; G11C 16/30
(Continued)

(56) References Cited

U.S. PATENT DOCUMENTS

2009/0141557 A1    6/2009  Fujiu
2010/0271861 A1   10/2010  Kitagawa
(Continued)

FOREIGN PATENT DOCUMENTS

EP         2241960 A1   10/2010
KR      1020060002801    1/2006

OTHER PUBLICATIONS

International Search Report and Written Opinion for PCT Patent Application No. PCT/US2015/022865, Mailed Jun. 10, 2015. 11 pages.
(Continued)

*Primary Examiner* — Han Yang
(74) *Attorney, Agent, or Firm* — Compass IP Law PC (57) ABSTRACT

The inhibit voltage is a voltage applied to wordlines adjacent to a program wordline having a memory cell to write during the program operation. The inhibit voltage for a program operation can be ramped up during the program pulse. Instead of applying a constant high inhibit voltage that results in the initial boosted channel potential reducing drastically due to leakage, a system can start the inhibit voltage lower and ramp the inhibit voltage up during the program pulse. The ramping up can be a continuous ramp or in finite discrete steps during the program pulse. Such ramping of inhibit voltage can provide better tradeoff between program disturb and inhibit disturb.

17 Claims, 5 Drawing Sheets

(51) Int. Cl.
   *G11C 16/10*   (2006.01)
   *G11C 16/04*   (2006.01)
   *G11C 16/08*   (2006.01)

(58) Field of Classification Search
   USPC ...................................... 365/185.17, 185.18
   See application file for complete search history.

(56) References Cited

U.S. PATENT DOCUMENTS

| | | |
|---|---|---|
| 2011/0157995 A1 | 6/2011 | Bicksler |
| 2012/0081963 A1* | 4/2012 | Dutta .................. G11C 7/02 365/185.17 |
| 2012/0082297 A1 | 4/2012 | Fox |
| 2012/0127794 A1 | 5/2012 | Moschiano et al. |
| 2012/0281487 A1 | 11/2012 | Sakaniwa et al. |
| 2012/0300550 A1* | 11/2012 | Hemink ............ G11C 16/3427 365/185.17 |
| 2013/0182505 A1* | 7/2013 | Liu ...................... G11C 16/10 365/185.17 |
| 2013/0258779 A1 | 10/2013 | Liu |
| 2014/0022195 A1* | 1/2014 | Lease ................ G06Q 30/0241 345/173 |
| 2014/0036595 A1 | 2/2014 | Binboga |

OTHER PUBLICATIONS

International Preliminary Report on Patentability, PCT/US2015/022865, Mailed Oct. 6, 2016, 8 pages.
KR Notice of Preliminary Rejection, 1 pages.

\* cited by examiner

RAMPING INHIBIT VOLTAGE DURING MEMORY PROGRAMMING

RELATED CASE INFORMATION

The present application is a Continuation of, and claims the benefit of priority of, U.S. patent application Ser. No. 14/228,245, filed Mar. 27, 2014.

FIELD

Embodiments of the invention are generally related to memory devices, and more particularly to ramping up an inhibit voltage during memory programming to improve the trade-off between program disturb and inhibit disturb.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2014, Intel Corporation, All Rights Reserved.

BACKGROUND

Computing devices rely on storage devices to store code and data used in the computing devices. Solid state memory devices provide nonvolatile storage without the mechanical parts used in conventional spinning disk storage devices. A common solid state storage technology is flash memory, and more specifically, NAND-based flash memory is particularly common. Solid state memory such as flash memory is written or programmed by applying a high voltage on the programmed wordline. A programmed cell lies at the intersection of the programmed wordline and selected bitline. An inhibited cell lies at the intersection of programmed wordline and unselected bitline. Cells that need to be programmed are held at a zero channel potential (by passing the voltage from the selected bitline to their channel) and those that do not need to be programmed are inhibited by boosting their channel (isolating them from the unselected bitline and allowing the channel to capacitively couple to the inhibit voltage). Inhibit voltage is applied on two or several adjacent wordlines to the programmed wordline. The boosted voltage of the inhibited channel can be referred to as boosted channel potential, and is typically higher than the normal operating voltage level at which data can be read from the memory device. The boosted channel potential of the inhibited channel is determined by the capacitive coupling from the inhibit voltage as well as the boost leakage in the channel.

Memory devices are susceptible to two different categories of program error, which are commonly referred to as "disturbs," or unintentional programming or changing other memory cells that are not the intended target of a write operation. The memory cells could be referred to as victim cells. The two categories of unintentional programming can be identified as program disturb (PD) and inhibit disturb (ID). PD occurs on cells belonging to the programmed wordline and unselected bitline. ID occurs on cells belonging to the inhibited wordlines (wordlines under the inhibit voltage) and the selected bitline. PD occurs when boosted channel potential is insufficient (low) in the inhibited channel, which causes unintentional programming. Typically, the system increases the inhibit voltage on the inhibit wordlines to improve the boosted channel potential on the unselected bitline, which ultimately reduces PD.

In ID, cells on the inhibit wordlines that are also on a selected bitline can be unintentionally written during the program operation, especially with high inhibit voltages. Thus, increasing the inhibit voltage can reduce PD, but increasing the inhibit voltage tends to increase the ID. It will thus be understood that there is a tradeoff between providing a sufficiently high inhibit voltage to maintain PD at a desired rate, and not increasing the inhibit voltage to maintain ID at a desired rate.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a program operation for memory cells includes ramping up the inhibit voltage during the program operation. The use of a ramped voltage can improve the tradeoff between PD (program disturb) and ID (inhibit disturb). By increasing the inhibit voltage during the program operation, the inhibited cells (those at the intersection of the programmed wordline and unselected bitline) see an improved average boosted channel potential, which reduces PD. ID can also be controlled by the selection of initial voltage and ramp-up slope of the inhibit voltage. In one embodiment, the overall average inhibit voltage can be held constant, and thus not affect the ID but significantly reduces PD. In one embodiment, for an equivalent PD, the overall average inhibit voltage can be reduced, and thus reduce the ID.

The ramping up of the inhibit voltage can offset the effects of leakage, which typically causes an increased PD in traditional programming implementations. When a constant inhibit voltage is applied, the boosted channel potential gradually leaks to a much smaller value. It will be understood that leakage is exponentially dependent on boosted potential. Higher boosted channel potential results in an exponentially higher leakage. Therefore, for a constant inhibit voltage, leakage is much higher at the outset and the initial boosted channel potential reduces very quickly. Instead of applying a constant inhibit voltage that reduces boost due to leakage, a system can start the inhibit voltage lower and ramp it during the program pulse duration. In one embodiment, the ramping up can be a continuous ramp up during the program pulse duration. Other, more complex, implementations can include periodic rising steps in the inhibit voltage instead of a constant ramp-up (which could be referred to as a periodic ramp-up).

It will be understood that a desired inhibit voltage is one that generates the fewest disturbed cells from both disturb mechanisms (PD and ID) combined. Instead of applying and holding a fixed high voltage level as the inhibit voltage, the system applies a voltage configured to improve the tradeoff between PD and ID. The system can more effectively shape the inhibit voltage waveform during the program operation to reduce the total number of disturbed cells. The ramping up of the inhibit voltage can be referred to as shaping the inhibit voltage waveform. Shaping the inhibit voltage waveform is in contrast to the traditional fixed inhibit voltage level.

Traditional systems provide a constant inhibit voltage during the entire program pulse to boost an inhibited channel. At the beginning of program pulse, the boosted channel potential is determined by the capacitive coupling from the inhibit wordlines. It will be understood that the initial boost is reduced over time due to electrons leaking into the channel, which ultimately determines the magnitude of PD. The boost leakage is exponentially dependent on the instantaneous boost. Thus, increasing the constant or fixed value of the inhibit voltage offers diminishing returns relative to PD improvement.

In one embodiment, the inhibit voltage shaping includes creating a triangular inhibit voltage waveform. Thus, in one embodiment, the continuous ramp up technique can be referred to as a triangular top-off (TTO) of the inhibit voltage. It will be understood that a TTO approach provides a continuous ramp up of the inhibit voltage, which can ensure that the boost loss due to leakage is compensated by the increase in inhibit voltage at every instant. TTO or other ramp up techniques can allow the reduction of the inhibit voltage at the beginning of the program pulse relative to the traditional fixed voltage approach.

Figure 1:
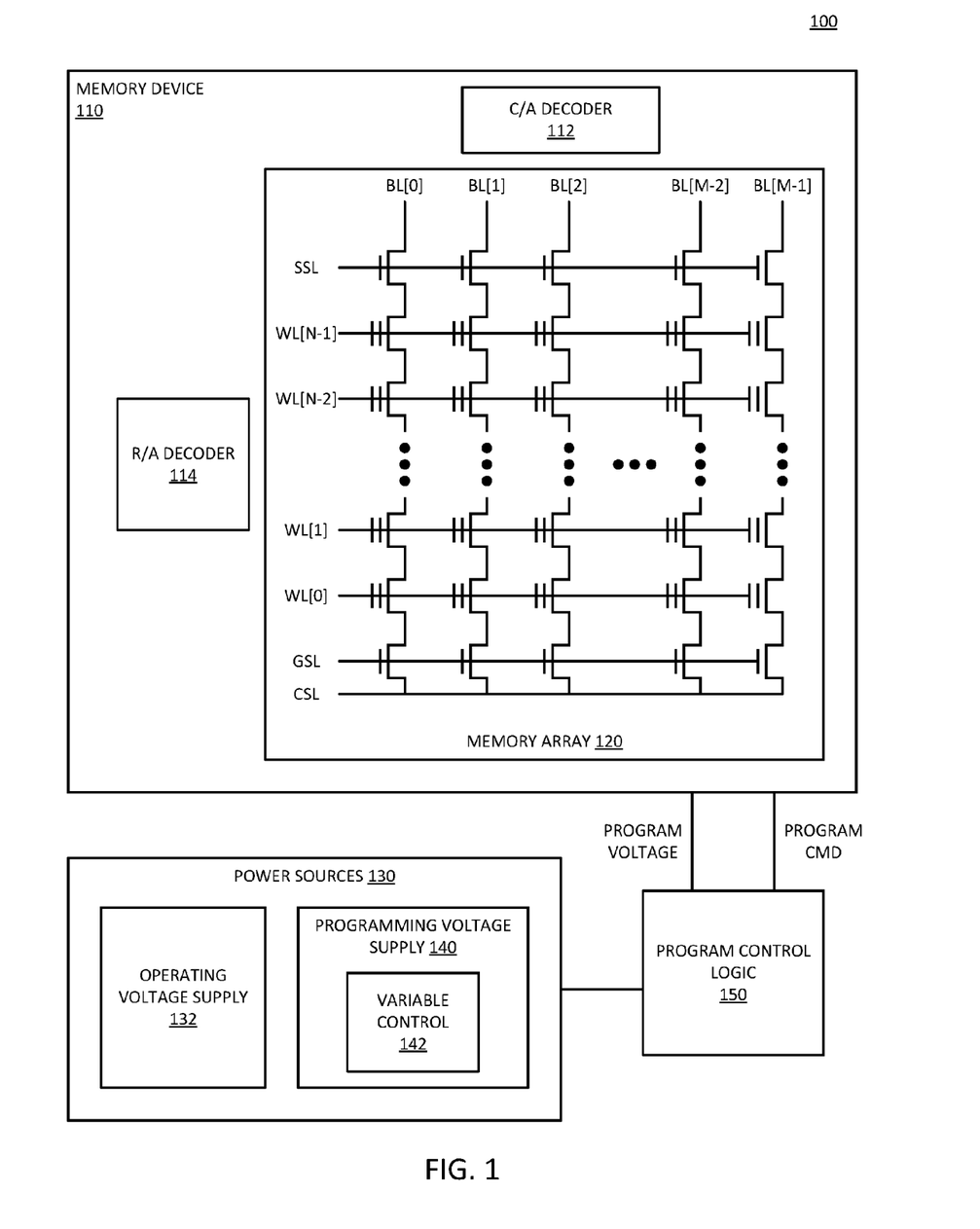
FIG. 1 is a block diagram of an embodiment of a system having a memory device in which an inhibit voltage is increased during a program operation window.

FIG. 1 is a block diagram of an embodiment of a system having a memory device in which a boost voltage is increased during a program operation window. System 100 represents a system in which inhibit voltage is ramped up during a program operation, and can be or include an electronic circuit and/or circuit device. System 100 includes memory device 110, which represents a memory device that is subject to program disturb and inhibit disturb for a program operation to write to one of the memory cells. In one embodiment, memory device 110 is a flash memory device or other NAND memory device.

Memory array 120 includes N wordlines (WL[0] to WL[N−1]). N can be, for example, 32 or 64, although in general the size of array 120 does not affect the cause of cell disturb or the ability to reduce cell disturb by ramping up the boost voltage. Array 120 includes M bitlines (BL[0] to BL[M−1]). In one embodiment, memory device 110 includes multiple arrays 120 or multiple banks of memory cells to store data in separately addressable locations. Each memory cell within array 120 is addressed or selected by asserting a wordline and a bitline. C/A (column address) decoder 112 can determine from a received command which bitline or bitlines to assert for a particular command. R/A (row address) decoder 114 can determine from a received command which wordline to assert for the command. In addition to the memory cells depicted, system 100 illustrates a string select line (SSL) that enables selection of bitlines, a ground select line (GSL), and a common source line (CSL), as are understood by those skilled in the art.

Memory device 110 operates based on power received from power sources 130. Power sources 130 represent the one or more voltage sources or voltage levels generated within system 100 to power electronic components of an electronic device, which can include system 100. Power sources 130 can include operating voltage supply 132, which provides a voltage level used by memory device 110 for read operations. Operating voltage supply 132 is typically a voltage level commonly used by other electronic components in an electronic system, and is the voltage level typically used to perform inter-device communication.

Power sources 130 also provides programming voltage supply 140, which is capable of generating voltage levels that are higher than operating voltage supply 132. Programming voltage supply 140 provides a voltage level that is high enough to overcome the channel threshold of the memory cells of memory array 120 to enable programming the memory cells. It will be understood that the specific voltage levels depend on device-specific characteristics and design, and thus can differ for devices from different manufacturers. In one embodiment, programming voltage supply 140 includes variable control 142, which represents circuit elements and/or logic that enables the power source to variably control the voltage output. For example, consistent with what is described above, variable control 142 can enable a continuous ramp up or a periodic ramp up of a voltage level.

Program control logic 150 represents hardware and/or logic by which memory device 110 receives a program command within system 100 and receives one or more program voltage levels. In one embodiment, program control logic 150 is part of memory device 110. The program command or commands cause system 100 to initiate a program operation for one or more memory cells of memory array 120. The program voltage can include a program voltage level to apply to a program wordline (e.g., a level high enough to program the memory cell). The program voltage can also represent an inhibit voltage applied to one or more wordlines adjacent to the program wordline to reduce program disturb. For example, if wordline WL[3] is the program wordline (meaning there are one or more cells in the wordline to write during the program operation), wordlines WL[2] and WL[4] can be biased to the inhibit voltage. Other wordlines can also be biased with the inhibit voltage when WL[3] is selected as the program wordline (such as WL[1] and WL[5]).

In one embodiment, the program voltage represents a ramped up inhibit voltage. More particularly, the inhibit voltage is ramped up during the program operation. Ramping up the voltage during the program operation is to be distinguished from ramping up or turning on or applying the supply voltage at other parts of operation of memory device 110. Ramping up the voltage is also to be distinguished from the delay to reach the target voltage resulting from the resistive and capacitive delay of the wordline. Whether or not there may be circumstances in which a voltage is ramped up at another time, or whether or not turning on the inhibit voltage initially can be considered to ramp up the voltage, traditional systems do not ramp up the inhibit voltage as described herein. Traditionally, the voltage provided to the inhibit wordlines is a fixed voltage applied by power sources 130. With the traditional fixed inhibit voltage, boosted channel potential as seen at an inhibited memory cell falls off exponentially due to leakage, even though the fixed voltage is applied. However, with the ramped up inhibit voltage described herein, programming voltage supply 140 and/or program control logic 150 provide a voltage level at the inhibit wordline(s) that changes during the program operation. It will be understood that the program operation is the window of time that a program pulse is asserted, in which a program voltage level is applied to the program wordline. With the ramped up inhibit voltage, the memory cell sees an increase of the boosted channel potential during the program pulse duration.

In one embodiment, the amount of voltage increase seen at the inhibit wordline(s) during the program operation window is set based on expected or known behavior of the devices in memory array 120. For example, traditionally the inhibit voltage is set to a fixed level such that any further increase in this fixed value generates more ID cells than reducing PD cells (total number of PD and ID cells is minimum). The exponential falloff of the resulting boosted channel potential with this optimal fixed voltage can be calculated based on knowledge of the memory architecture, capacitive coupling to the channel and boost leakage characteristics. Over the period of the program operation window, such a traditional approach will result in an average boosted potential being seen by the channel of the inhibited memory cell over the program pulse duration. For example, an 11 V fixed inhibit voltage generates 10 V of boosted channel potential at the outset of program operation. This potential falls off to approximately 6 V over the course of a 15 microsecond window of time, for an average of just over 7 V seen at the memory cell over the entire program pulse duration. Consider instead an initial inhibit voltage of approximately 7 V and ramping up to 12 V during the program window. In one embodiment, at every instant of time during the programming pulse, the boosted channel potential that is lost due to leakage is continuously replenished by the instantaneous increase in inhibit voltage due to the ramp. In such a case the average voltage seen at the channel of the inhibited memory cell would be much higher (for example, over 8 V) than the average boosted channel potential seen in the traditional approach (7 V), which reduces PD. Furthermore, since the inhibit voltage for the ramped case is lower than the traditional fixed case (11 V) for most of the duration of the program pulse, ID on the other cells on the programmed bitlines is also reduced with the ramped inhibit approach.

Figure 2:
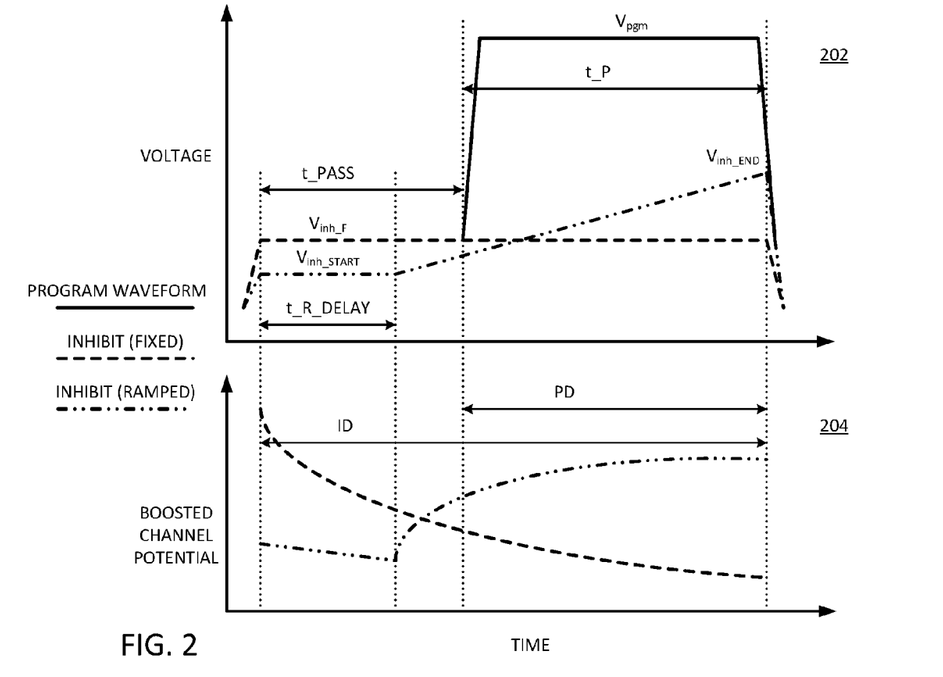
FIG. 2 is a diagrammatic representation of an embodiment of voltage waveforms in a system that ramps inhibit voltage up during a program operation.

FIG. 2 is a diagrammatic representation of an embodiment of voltage waveforms in a system that ramps inhibit voltage up during a program operation. Diagram 202 represents various inhibit voltage waveforms. Diagram 204 represents the boosted channel potential of an inhibited memory cell.

Referring first to diagram 202, Vpgm represents a programming voltage applied to the program wordline. It will be understood that the scale of the voltage levels is not explicitly shown in diagrams 202 and 204. Vinh_F represents a traditional fixed inhibit voltage, and is shown for relative comparison. It will be understood that the voltages in diagram 202 represent voltages as applied to the memory device, while the boosted channel potential at the inhibited memory cells generated by those voltage levels is represented in diagram 204.

With a ramped inhibit voltage, there is at least one start and end voltage for the inhibit voltage. Diagram 202 represents a continuously increasing ramp up voltage. Vinh_START represents a starting voltage applied to the inhibit wordlines. Vinh_END represents an ending voltage applied to the inhibit wordlines. Typically, Vinh_START is lower than Vinh_F and Vinh_END is higher than Vinh_F. The initial boosted channel potential is proportional to the inhibit voltage and is therefore higher for the traditional inhibit voltage approach (as seen in diagram 204). However, as the leakage is exponentially higher for higher channel boost potential, this boost is quickly reduced followed by an exponential falloff for the fixed inhibit voltage approach. The initial leakage for the ramped inhibit voltage approach is much lower and therefore the initial falloff in boosted channel potential is lower. When the inhibit voltage starts ramping, the boosted channel potential also starts rising due to the capacitive coupling from the inhibit voltage wordlines. It will be observed that such continuous rise in boosted channel potential will gradually saturate, and the asymptote occurs where the instantaneous increase in potential resulting from the ramp equals the leakage created by that instantaneous potential (high potentials cause increased leakage).

Referring to the timing, it will be observed that ID is active during the entire duration of the inhibit pulse width (t_PASS+t_P) and PD is active only during the program pulse width (t_P) or period of a program enable pulse. The time period t_PASS represents a time period from when the system begins to bias the wordlines, to when a program signal is asserted. The time period t_P is the period of time or window during which the program signal is asserted. The periods of time, like the voltage levels, are dependent on architecture of the devices and system-specific characteristics. The time period t_R_DELAY (delay for the ramped inhibit voltage) represents a delay period of time between when the inhibit voltage bias is reached, and when the system begins to ramp up the voltage.

As seen in diagram 204, the boosted channel potential for the fixed inhibit voltage at the outset is determined by Vinh_F and the capacitive coupling of the inhibited wordlines to the channel. The evolution of the boosted channel potential is then determined by the instantaneous leakage. It will be understood that because the rate of leakage is much higher at high boost conditions, further increasing Vinh_F would ultimately offer diminishing returns towards improving boosted channel potential during program pulse width. Additionally, a high Vinh_F required to support a high boost causes unnecessary ID during the period t_PASS.

As also seen in diagram 204, by keeping the initial inhibit voltage in the ramped approach (Vinh_START) low, ID during t_PASS is reduced, compared to the traditional fixed inhibit voltage approach (higher initial voltage potential corresponds to higher ID). The system can keep Vinh_START low during t_PASS because PD is inactive during that period, and therefore decreasing the inhibit voltage will not affect PD. In one embodiment, the ramped inhibit voltage is a triangular ramp that begins after the delay period (t_R_DELAY) and continues ramping until the end of the Vpgm pulse.

The actual values of t_R_DELAY, Vinh_START, and Vinh_END can be computed or determined based on the boost leakage characteristics of the channel. It should be noted that the optimal t_R_delay can be smaller than, greater than, or equal to t_PASS in actual implementation. Ramping up the inhibit voltage can provide a higher average channel boost potential to reduce PD during t_P. It will be understood that maintaining the ID low during t_PASS can allow a higher value of Vinh_END (relative to the value of Vinh_F) without adversely affecting the overall ID. In one embodiment, values for Vinh_START and Vinh_END are determined by calculating what voltage level would be needed to counter the potential leakage for the memory device at every moment, or for sub-periods of time. In one embodiment, the ramped inhibit voltage has a triangular slope at every microsecond of the curve, but is not necessarily a straight increase over the entire period. Countering the leakage allows the system to improve the PD while maintaining the same ID that can be obtained traditionally.

Figure 3:
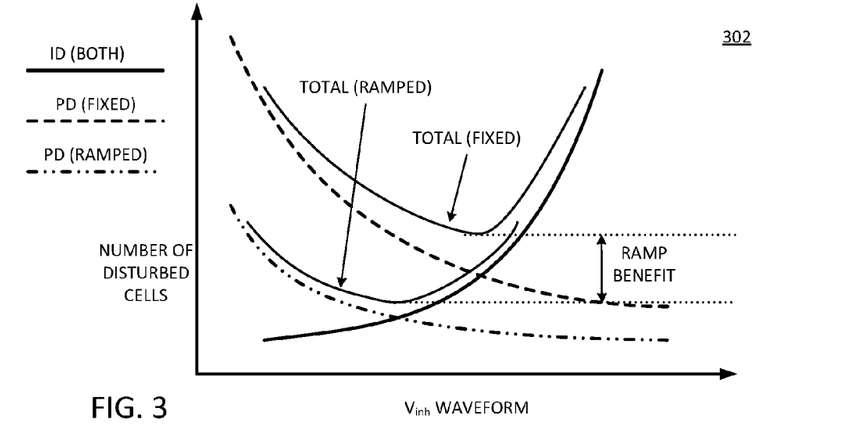
FIG. 3 is a diagrammatic representation of an embodiment of dependence of the two disturb mechanisms on a fixed inhibit voltage and a ramped inhibit voltage.

FIG. 3 is a diagrammatic representation of an embodiment of the dependence of PD and ID on a fixed voltage boost and a ramped voltage boost. Diagram 302 provides a graphical representation of the number of disturbed cells that occur in a system versus the inhibit voltage waveform, and more specifically, the fixed voltage for a fixed Vinh implementation, and a start voltage for a ramped Vinh implementation. It will be understood that the diagram represents general shapes of the curves without necessarily being to scale.

The upper exponential curve (simple dash pattern) starts on the left and falls off to the right, and represents the PD for a traditional fixed inhibit voltage implementation. The lower exponential curve (dash-dot pattern) also starts on the left and falls off to the right, and represents the PD for a ramped inhibit voltage implementation in accordance with an embodiment described herein. It will be observed that the ramped inhibit voltage provides a lower PD than the traditional approach.

Both curves cross a solid curve that starts low at the left and exponentially grows to the right. That curve represents the ID for either inhibit voltage waveform because this particular diagram assumes that the shape of the ramp inhibit waveform (Vinh_START, Vinh_END and t_R_DELAY) is chosen appropriately so that it matches the ID of the traditional fixed inhibit voltage approach while improving the PD. The two solid U-shaped curves indicate total disturbs, which can be calculated by adding the PD and the ID together. Thus, the minimum total number of disturbs possible for the fixed inhibit voltage implementation is higher than the minimum total number of disturbs for the ramped inhibit voltage implementation.

It can be assumed that a system designer would select the point of best performance for any implementation. Thus, the Vinh_F voltage would be selected as the voltage that produces the lowest point in the U-shaped total curve for fixed inhibit voltage, and the Vinh_START, Vinh_END, and t_R_DELAY would be appropriately selected to produce the lowest point in the U-shaped total curve for ramped inhibit voltage. The difference between those two lowest points can be understood as the benefit of ramping up the inhibit voltage.

Figure 4:
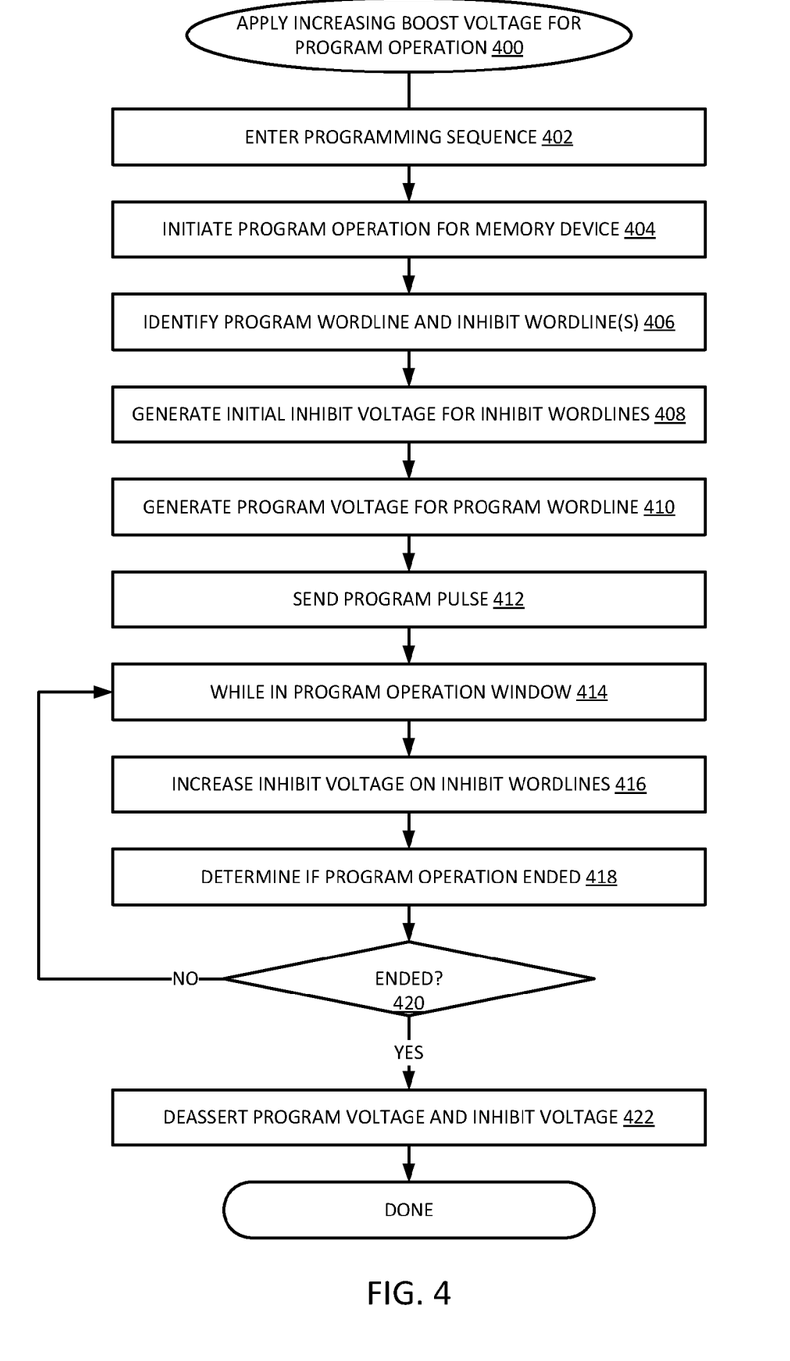
FIG. 4 is a flow diagram of an embodiment of a process for increasing inhibit voltage during a program operation.

FIG. 4 is a flow diagram of an embodiment of a process for increasing the inhibit voltage for a program operation. Process 400 is a process for applying increasing the inhibit voltage for a program operation. A system having a memory device that supports increasing or ramped boost voltage enters a programming sequence or a programming state, 402. For example, the system can encounter a write command to request the memory device to write data to one or more memory cells. The system can initiate the program operation for the memory device, 404, for example, by sending a memory write command to the memory device. The command can include various signals generated by control logic to cause the memory device to perform a requested write operation.

The memory device decodes the program operation request or write command and identifies the program wordline and one or more inhibit wordlines, 406. The program wordline is the wordline that has a memory cell that will be programmed during the program operation to satisfy the request or command. The inhibit wordlines are wordlines adjacent to the program wordline. Applying an inhibit voltage to the inhibit wordlines can reduce the risk of unintentional programming of the inhibited cell on the unselected bitline by capacitively coupling their channel to the inhibit voltage during the program operation.

The system generates an inhibit voltage for the inhibit wordlines, 408. The inhibit voltage generated at the beginning of the program operation is an initial inhibit voltage (e.g., Vinh_START), which the system will increase during the program operation. The initial inhibit voltage can be kept lower than a traditional inhibit voltage. The leakage from the lower initial inhibit voltage will be less than from a higher voltage, and the lower voltage will result in a lower ID. The system generates a program voltage to apply to the program wordline during the program pulse, 410.

The system generates the program pulse, 412, and initiates the program operation. While in the program operation window, 414, or during the pulse, the system can increase the inhibit voltage on the inhibit wordlines, 416. Ramping up the inhibit voltage is one way to increase the boosted channel potential. In one embodiment, the system generates a continuous ramp up voltage during the entire program pulse. The ramping up can refer to several intervals in which the system increases the inhibit voltage during the program operation, without necessarily generating a continuous ramp up. The system can determine if the program operation is ended, 418. If the program operation is ended, 420 YES branch, the system can deassert the program voltage from the program wordline and the inhibit voltage from the inhibit wordlines, 422. If the program operation is not ended, 420 NO branch, in one embodiment the system will continue to ramp up the inhibit voltage, returning to 414.

Figure 5:
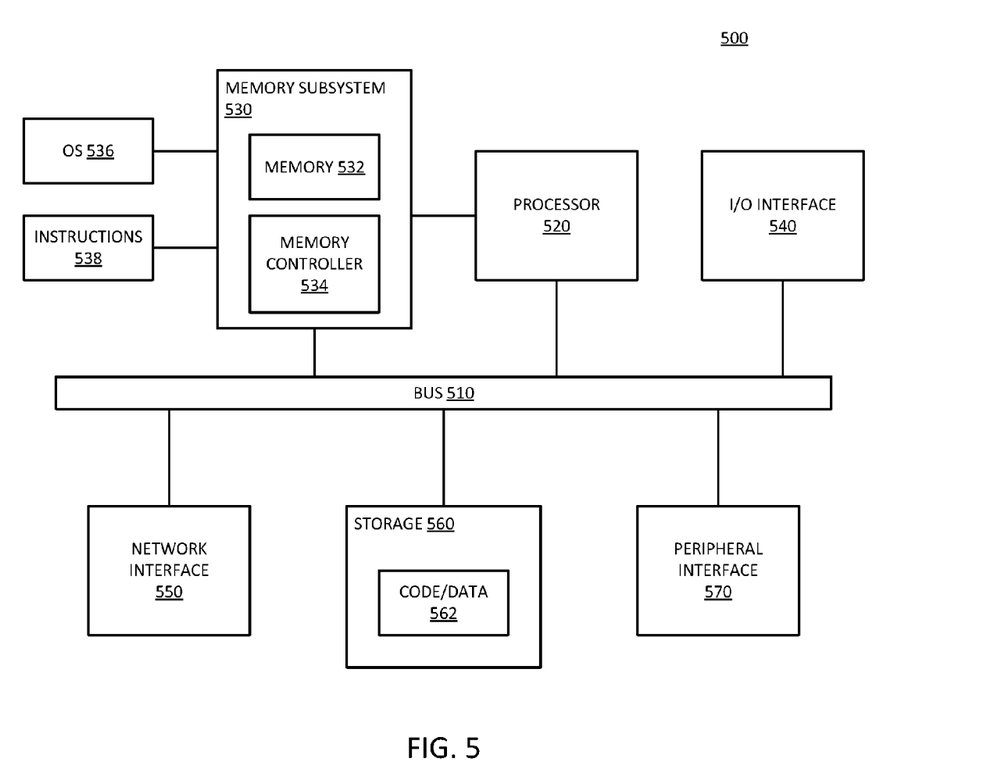
FIG. 5 is a block diagram of an embodiment of a computing system in which inhibit voltage ramping can be implemented.

FIG. 5 is a block diagram of an embodiment of a computing system in which boost voltage ramping can be implemented. System 500 represents a computing device in accordance with any embodiment described herein, and can be a laptop computer, a storage device, a desktop computer, a server, a gaming or entertainment control system, a scanner, copier, printer, routing or switching device, or other electronic device. System 500 includes processor 520, which provides processing, operation management, and execution of instructions for system 500. Processor 520 can include any type of microprocessor, central processing unit (CPU), processing core, or other processing hardware to provide processing for system 500. Processor 520 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 can include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520. Memory subsystem 530 includes memory device 532 where it stores data, instructions, programs, or other items. In one embodiment, memory subsystem includes memory controller 534, which is a memory controller to generate and issue commands to memory device 532. It will be understood that memory controller 534 could be a physical part of processor 520.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 can also correspond to interfaces in network interface 550.

System 500 also includes one or more input/output (I/O) interface(s) 540, network interface 550, one or more internal mass storage device(s) 560, and peripheral interface 570 coupled to bus 510. I/O interface 540 can include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 can include an Ethernet adapter, wireless interconnection components, USB (universal serial bus), or other wired or wireless standards-based or proprietary interfaces.

Storage 560 can be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 can be generically considered to be a "memory," although memory 530 is the executing or operating memory to provide instructions to processor 520. Whereas storage 560 is nonvolatile, memory 530 can include volatile memory (i.e., the value or state of the data is indeterminate if power is interrupted to system 500).

Peripheral interface 570 can include any hardware interface not specifically mentioned above. Peripherals refer generally to devices that connect dependently to system 500. A dependent connection is one where system 500 provides the software and/or hardware platform on which operation executes, and with which a user interacts.

In one embodiment, processor 520 executes operations on data stored in memory subsystem 530 and/or storage 560 (e.g., a solid state drive (SSD) using NAND technology). Memory subsystem 530 and/or storage 560 can include a memory device that is programmed by applying a program voltage to a program wordline and an inhibit voltage to an inhibit wordline. To program such a memory device, the system can ramp up the inhibit voltage during the program operation. Thus, the system applies an initial inhibit voltage to the inhibit wordline(s), and increases the inhibit voltage during the program operation. Apply an increasing inhibit voltage can improve total cell disturb performance within the memory device, and allow more flexibility in addressing the tradeoff between ID and PD.

Figure 6:
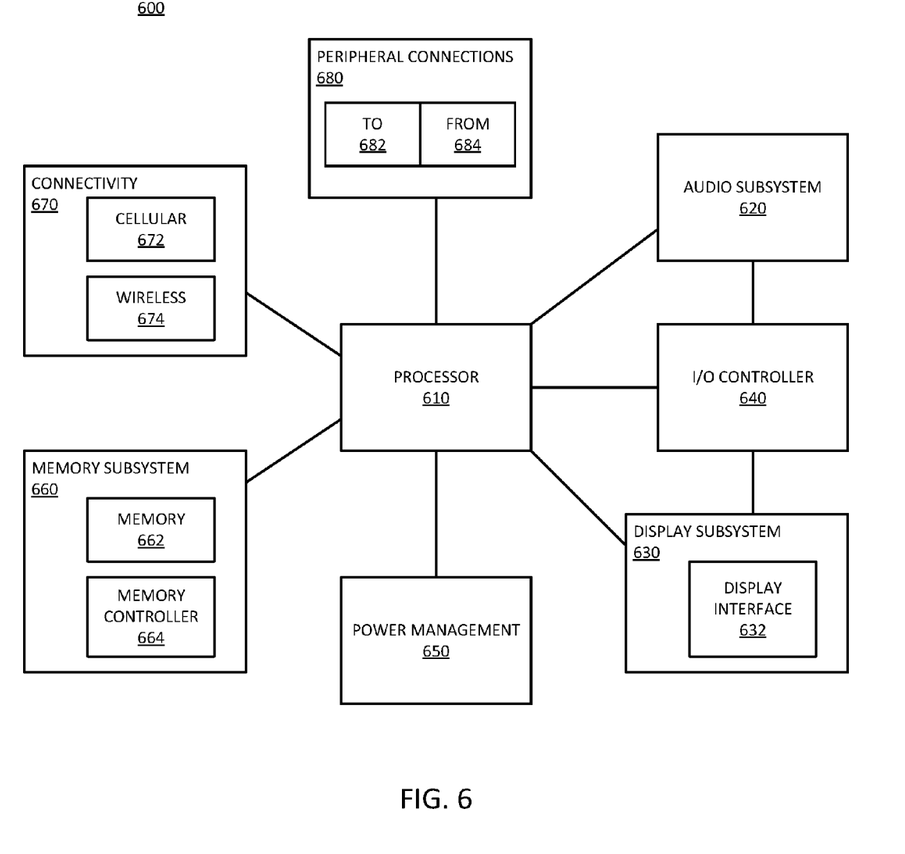
FIG. 6 is a block diagram of an embodiment of a mobile device in which inhibit voltage ramping can be implemented.

FIG. 6 is a block diagram of an embodiment of a mobile device in which boost voltage ramping can be implemented. Device 600 represents a mobile computing device, such as a computing tablet, a high-performance server, a mobile phone or smartphone, a wireless-enabled e-reader, wearable computing device, or other mobile device. It will be understood that certain of the components are shown generally, and not all components of such a device are shown in device 600.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations can also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that can be included in device 600. The input can be part of direct user interaction, as well as providing environmental input to the system to influence its operations (such as filtering for noise, adjusting displays for brightness detection, applying a flash for a camera, or other features). In one embodiment, device 600 includes power management 650 that manages battery power usage, charging of the battery, and features related to power saving operation.

Memory subsystem 660 includes memory device(s) 662 for storing information in device 600. Memory subsystem 660 can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600. In one embodiment, memory subsystem 660 includes memory controller 664 (which could also be considered part of the control of system 600, and could potentially be considered part of processor 610). Memory controller 664 includes a scheduler to generate and issue commands to memory device 662.

Connectivity 670 includes hardware devices (e.g., wireless and/or wired connectors and communication hardware) and software components (e.g., drivers, protocol stacks) to enable device 600 to communicate with external devices. The external device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, processor 610 executes operations on data stored in memory subsystem 660, which can include an SSD or other NAND device. Memory subsystem 660 can include a memory device that is programmed by applying a program voltage to a program wordline and an inhibit voltage to an inhibit wordline. To program such a memory device, the system can ramp up the inhibit voltage during the program operation. Thus, the system applies an initial inhibit voltage to the inhibit wordline(s), and increases the inhibit voltage during the program operation. Apply an increasing inhibit voltage can improve total cell disturb performance within the memory device, and allow more flexibility in addressing the tradeoff between ID and PD.

In one aspect, a method includes: initiating a program operation for a memory cell in a program wordline of a memory device, the program operation having an associated program operation window during which the program operation executes; generating an initial inhibit voltage for one or more wordlines adjacent to the program wordline for a start of the program operation; and ramping up the inhibit voltage during the program operation window.

In one embodiment, the program operation window comprises a width of a program enable pulse. In one embodiment, generating the initial inhibit voltage and ramping the inhibit voltage up during the program operation window comprise ramping the inhibit voltage from an initial value to a final value, both selected to result in an average boosted channel potential higher than the average boosted channel potential resulting from initiating the inhibit voltage at a fixed level and that results in a same inhibit disturb. In one embodiment, ramping up the inhibit voltage during the program operation window comprises continuously ramping up the inhibit voltage during the program operation window. In one embodiment, ramping up the inhibit voltage comprises ramping up the inhibit voltage with a triangular slope. In one embodiment, the memory device comprises a NAND flash memory device. In one embodiment, the inhibit voltage comprises an inhibit voltage applied to multiple wordlines adjacent to the program wordline.

In one aspect, a memory subsystem includes: a memory device including a memory cell in a wordline of the memory device, the memory cell programmable via a program operation, the program operation triggered by a program operation signal having an associated program operation window; program control logic to initiate a program operation to program the memory cell, including setting the program operation signal; and a voltage source to generate an initial inhibit voltage for one or more adjacent wordlines adjacent to the wordline of the memory cell for the program operation, and to ramp up the initial inhibit voltage during the program operation signal.

In one embodiment, the program operation signal comprises a program enable pulse. In one embodiment, the voltage source is to generate the initial inhibit voltage and ramp up the inhibit voltage including ramping the inhibit voltage from an initial value to a final value both selected to result in an average boosted channel potential significantly higher than an average boosted channel potential resulting from initiating the inhibit voltage at a fixed level that results in a same inhibit disturb. In one embodiment, the voltage source is to continuously ramp up the inhibit voltage during the program operation window. In one embodiment, the voltage source is to ramp up the inhibit voltage with a triangular slope. In one embodiment, the voltage source is to ramp up the inhibit voltage periodically during the program operation window. In one embodiment, the memory device comprises a NAND flash memory device.

In one aspect, an electronic device includes: a memory subsystem to store data, the memory subsystem including a memory device including a memory cell in a wordline of the memory device, the memory cell programmable via a program operation, the program operation triggered by a program operation signal having an associated program operation window; program control logic to initiate a program operation to program the memory cell, including setting the program operation signal; and a voltage source to generate an initial inhibit voltage for one or more wordlines adjacent to the wordline of the memory cell for the program operation, and to ramp up the inhibit voltage during the program operation signal; and a touchscreen display coupled to generate a display based on data accessed from the memory device.

In one embodiment, the program operation signal comprises a program enable pulse. In one embodiment, the voltage source is to generate the initial inhibit voltage and ramp up the inhibit voltage including ramping the program voltage from an initial value to a final value both selected to result in an average boosted channel potential significantly higher than an average boosted channel potential resulting from initiating the inhibit voltage at a fixed level that results in a same inhibit disturb. In one embodiment, the voltage source is to continuously ramp up the inhibit voltage during the program operation window. In one embodiment, the voltage source is to ramp up the inhibit voltage periodically during the program operation window. In one embodiment, the voltage source is to ramp up the inhibit voltage with a triangular slope. In one embodiment, the memory device comprises a NAND flash memory device.

In one aspect, an article of manufacture comprising a computer readable storage medium having content stored thereon, which when executed performs operations including: initiating a program operation for a memory cell in a program wordline of a memory device, the program operation having an associated program operation window during which the program operation executes; generating an initial inhibit voltage for one or more wordlines adjacent to the program wordline for a start of the program operation; and ramping up the inhibit voltage during the program operation window.

In one embodiment, the program operation window comprises a width of a program enable pulse. In one embodiment, the content for generating the initial inhibit voltage and the content for ramping the inhibit voltage up during the program operation window comprise content for ramping the inhibit voltage from an initial value to a final value, both selected to result in an average boosted channel potential higher than the average boosted channel potential resulting from initiating the inhibit voltage at a fixed level and that results in a same inhibit disturb. In one embodiment, the content for ramping up the inhibit voltage during the program operation window comprises content for continuously ramping up the inhibit voltage during the program operation window. In one embodiment, the content for ramping up the inhibit voltage comprises content for ramping up the inhibit voltage with a triangular slope. In one embodiment, the memory device comprises a NAND flash memory device. In one embodiment, the inhibit voltage comprises an inhibit voltage applied to multiple wordlines adjacent to the program wordline.

In one aspect, an apparatus includes: means for generating a first deck of circuit elements, the first deck having multiple tiers of circuit elements stacked above a source conductor; means for initiating a program operation for a memory cell in a program wordline of a memory device, the program operation having an associated program operation window during which the program operation executes; means for generating an initial inhibit voltage for one or more wordlines adjacent to the program wordline for a start of the program operation; and means for ramping up the inhibit voltage during the program operation window.

In one embodiment, the program operation window comprises a width of a program enable pulse. In one embodiment, the means for generating the initial inhibit voltage and the means for ramping the inhibit voltage up during the program operation window comprise means for ramping the inhibit voltage from an initial value to a final value, both selected to result in an average boosted channel potential higher than the average boosted channel potential resulting from initiating the inhibit voltage at a fixed level and that results in a same inhibit disturb. In one embodiment, the means for ramping up the inhibit voltage during the program operation window comprises means for continuously ramping up the inhibit voltage during the program operation window. In one embodiment, the means for ramping up the inhibit voltage comprises means for ramping up the inhibit voltage with a triangular slope. In one embodiment, the memory device comprises a NAND flash memory device. In one embodiment, the inhibit voltage comprises an inhibit voltage applied to multiple wordlines adjacent to the program wordline.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
   initiating a program operation for a memory cell in a program wordline of a memory device, the program operation having an associated program operation window during which the program operation executes;
   generating an initial inhibit voltage for one or more wordlines adjacent to the program wordline for a start of the program operation; and
   continuously ramping up the inhibit voltage in a straight line starting prior to the program operation window until at least the end of the program operation window.

2. The method of claim 1, wherein the program operation window comprises a width of a program enable pulse.

3. The method of claim 1, wherein generating the initial inhibit voltage and ramping the inhibit voltage up during the program operation window comprise ramping the inhibit voltage from an initial value to a final value, both selected to result in an average boosted channel potential higher than the average boosted channel potential resulting from initiating the inhibit voltage at a fixed level and that results in a same inhibit disturb.

4. The method of claim 1, wherein ramping up the inhibit voltage comprises ramping up the inhibit voltage with a triangular slope starting prior to the program operation window until at least the end of the program operation window.

5. The method of claim 1, wherein the memory device comprises a NAND flash memory device.

6. The method of claim 1, wherein the inhibit voltage comprises an inhibit voltage applied to multiple wordlines adjacent to the program wordline.

7. A memory subsystem, comprising:
   a memory device including a memory cell in a wordline of the memory device, the memory cell programmable via a program operation, the program operation triggered by a program operation signal having an associated program operation window;
   program control logic to initiate a program operation to program the memory cell, including setting the program operation signal; and
   a voltage source to generate an initial inhibit voltage for one or more adjacent wordlines adjacent to the wordline of the memory cell for the program operation, and to continuously ramp up the initial inhibit voltage in a straight line starting prior to the program operation window until at least the end of the program operation window.

8. The memory subsystem of claim 7, wherein the program operation signal comprises a program enable pulse.

9. The memory subsystem of claim 7, wherein the voltage source is to generate the initial inhibit voltage and ramp up the inhibit voltage including ramping the inhibit voltage from an initial value to a final value both selected to result in an average boosted channel potential significantly higher than an average boosted channel potential resulting from initiating the inhibit voltage at a fixed level that results in a same inhibit disturb.

10. The memory subsystem of claim 7, wherein the voltage source is to ramp up the inhibit voltage with a triangular slope starting prior to the program operation window until at least the end of the program operation window.

11. The memory subsystem of claim 7, wherein the voltage source is to ramp up the inhibit voltage periodically during the program operation window.

12. The memory subsystem of claim 7, wherein the memory device comprises a NAND flash memory device.

13. An electronic device comprising:
   a memory subsystem to store data, the memory subsystem including
      a memory device including a memory cell in a wordline of the memory device, the memory cell programmable via a program operation, the program operation triggered by a program operation signal having an associated program operation window;
      program control logic to initiate a program operation to program the memory cell, including setting the program operation signal; and
      a voltage source to generate an initial inhibit voltage for one or more wordlines adjacent to the wordline of the memory cell for the program operation, and to continuously ramp up the inhibit voltage in a straight line starting prior to the program operation window until at least the end of the program operation window; and
   a touchscreen display coupled to generate a display based on data accessed from the memory device.

14. The electronic device of claim 13, wherein the program operation signal comprises a program enable pulse.

15. The electronic device of claim 13, wherein the voltage source is to generate the initial inhibit voltage and ramp up the inhibit voltage including ramping the program voltage from an initial value to a final value both selected to result in an average boosted channel potential significantly higher than an average boosted channel potential resulting from initiating the inhibit voltage at a fixed level that results in a same inhibit disturb.

16. The electronic device of claim 13, wherein the voltage source is to ramp up the inhibit voltage with a triangular slope starting prior to the program operation window until at least the end of the program operation window.

17. The electronic device of claim 13, wherein the memory device comprises a NAND flash memory device.

* * * * *